United States Patent
Shin et al.

(10) Patent No.: US 10,332,682 B2
(45) Date of Patent: Jun. 25, 2019

(54) THIN-FILM CAPACITOR HAVING VIAS CONNECTED TO RESPECTIVE ELECTRODE LAYERS

(71) Applicant: SAMSUNG ELECTRO-MECHANICS CO., LTD., Suwon-si, Gyeonggi-do (KR)

(72) Inventors: Hyun Ho Shin, Suwon-si (KR); Su Bong Jang, Suwon-si (KR); Seung Mo Lim, Suwon-si (KR); Sang Jong Lee, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/479,456

(22) Filed: Apr. 5, 2017

(65) Prior Publication Data

US 2018/0061573 A1 Mar. 1, 2018

(30) Foreign Application Priority Data

Sep. 1, 2016 (KR) .................. 10-2016-0112392

(51) Int. Cl.
*H01G 4/232* (2006.01)
*H01G 4/30* (2006.01)
(Continued)

(52) U.S. Cl.
CPC ............ *H01G 4/232* (2013.01); *H01G 4/306* (2013.01); *H01G 4/33* (2013.01); *H01L 23/481* (2013.01); *H01L 28/60* (2013.01)

(58) Field of Classification Search
CPC ............................. H01G 4/232; H01G 4/306
See application file for complete search history.

(56) References Cited

U.S. PATENT DOCUMENTS 6,724,611 B1 * 4/2004 Mosley ................. H01G 4/228
257/E27.116
8,008,161 B2 * 8/2011 Bachmann .......... H01L 27/0805
257/E21.004
(Continued)

FOREIGN PATENT DOCUMENTS

JP 07326536 A * 12/1995
JP 2000-514243 A 10/2000
(Continued)

OTHER PUBLICATIONS

Office Action issued in corresponding Korean Patent Application No. 10-2016-0112392, dated Aug. 22, 2017, with English Translation.

*Primary Examiner* — David M Sinclair
(74) *Attorney, Agent, or Firm* — Morgan Lewis & Bockius LLP

(57) ABSTRACT

A thin-film capacitor includes a body in which a plurality of dielectric layers and first and second electrode layers are alternately stacked on a substrate, first and second electrode pads are on external surfaces of the body, and a plurality of vias are within the body. Among the plurality of vias, a first via connects the first electrode layer and the first electrode pad, and a second via connects the second electrode layer and the second electrode pad. The first via and the second via are units each include a plurality of vias, and the first via unit and the second via unit are alternately disposed on an upper surface of the body.

19 Claims, 11 Drawing Sheets

(51) Int. Cl.
    *H01G 4/33*     (2006.01)
    *H01L 23/48*     (2006.01)
    *H01L 49/02*     (2006.01)

(56) References Cited

U.S. PATENT DOCUMENTS

| | | | |
|---|---|---|---|
| 8,997,321 B2* | 4/2015 | Komuro | H01G 4/228 29/25.03 |
| 2004/0190218 A1* | 9/2004 | Li | H01G 4/232 361/302 |
| 2006/0180938 A1 | 8/2006 | Kurihara et al. | |
| 2008/0237794 A1 | 10/2008 | Shoji | |
| 2010/0246092 A1* | 9/2010 | Shibue | H01G 4/232 361/313 |
| 2010/0252527 A1* | 10/2010 | Takeshima | H01G 4/228 216/13 |
| 2013/0043509 A1* | 2/2013 | Cho | H01L 27/11526 257/208 |
| 2013/0120905 A1* | 5/2013 | Son | H01F 17/0033 361/321.2 |

FOREIGN PATENT DOCUMENTS

| | | | |
|---|---|---|---|
| JP | 2007-184324 A | | 7/2007 |
| JP | 2008-251972 A | | 10/2008 |
| JP | 2008252011 A | * | 10/2008 |
| KR | 10-2006-0091224 A | | 8/2006 |
| WO | 98/00871 A1 | | 1/1998 |

* cited by examiner ated on September 1, 2016 in the Korean Intellectual Property Office, the disclosure of which is incorporated herein by reference in its entirety.

THIN-FILM CAPACITOR HAVING VIAS CONNECTED TO RESPECTIVE ELECTRODE LAYERS

CROSS-REFERENCE TO RELATED APPLICATION(S)

This application claims benefit of priority to Korean Patent Application No. 10-2016-0112392 filed on Sep. 1, 2016 in the Korean Intellectual Property Office, the disclosure of which is incorporated herein by reference in its entirety.

BACKGROUND

1. Field

The present disclosure relates to a thin-film capacitor.

2. Description of Related Art

Recently, portable information technology (IT) products such as smartphones, wearable devices, and the like, have been increasingly reduced in thickness. In line with this, there is an increased necessity for thin passive elements to reduce the thickness of the overall package.

To this end, there is a growing demand for thin-film capacitors with a smaller thickness than that of multilayer ceramic capacitors (MLCCs).

For capacitors manufactured through a thin film method, the method used to form the via connecting an external electrode to an electrode layer and connecting electrode layers is important. The via forming method and final structure affect the performance of thin-film capacitors.

In a related art thin-film capacitor manufacturing method, when a via is formed after repeatedly stacking dielectric layers and electrode layers, a single via is required for a single layer electrode, and vias corresponding to the number of electrode layers are formed.

Also, as a method for patterning in stacking electrode layers, even numbered electrode layers and odd numbered electrode layers are stacked in different forms and one side is etched to expose only even numbered or odd numbered electrode layers to connect an electrode.

However, the aforementioned methods are relatively complicated and may incur increased manufacturing costs. Thus, a technique for easily manufacturing a more compact thin-film capacitor is required.

On the other hand, when a plurality of dielectric layers are stacked using a thin film technique, it is very important to stably connect electrode layers disposed above and below each of the dielectric layers to enhance product reliability.

SUMMARY

An aspect of the present disclosure may provide a reliable compact thin-film capacitor with high capacitance.

According to an aspect of the present disclosure, a thin-film capacitor may include a body in which a plurality of dielectric layers and first and second electrode layers are alternately stacked on a substrate, first and second electrode pads are on external surfaces of the body, and a plurality of vias are within the body. Among the plurality of vias, a first via connects the first electrode layer and the first electrode pad, and a second via connects the second electrode layer and the second electrode pad. The first via and the second via are units each include a plurality of vias, and the first via unit and the second via unit are alternately disposed on an upper surface of the body.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Exemplary embodiments in the present disclosure will now be described in detail with reference to the accompanying drawings.

Hereinafter, a thin-film capacitor according to the present exemplary embodiment will be described.

Figure 1:
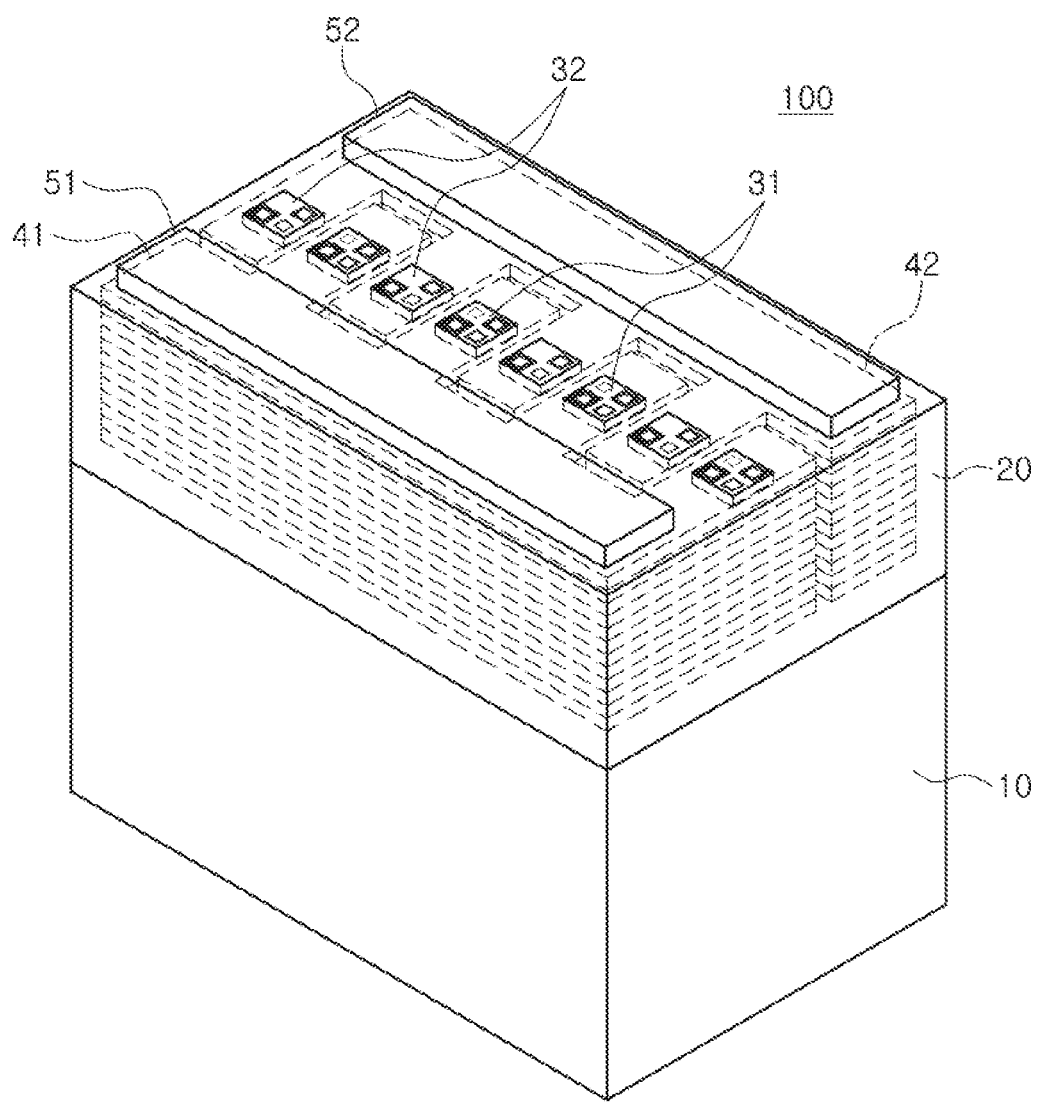
FIG. 1 is a schematic perspective view of a thin-film capacitor according to an exemplary embodiment in the present disclosure.
Figure 2:
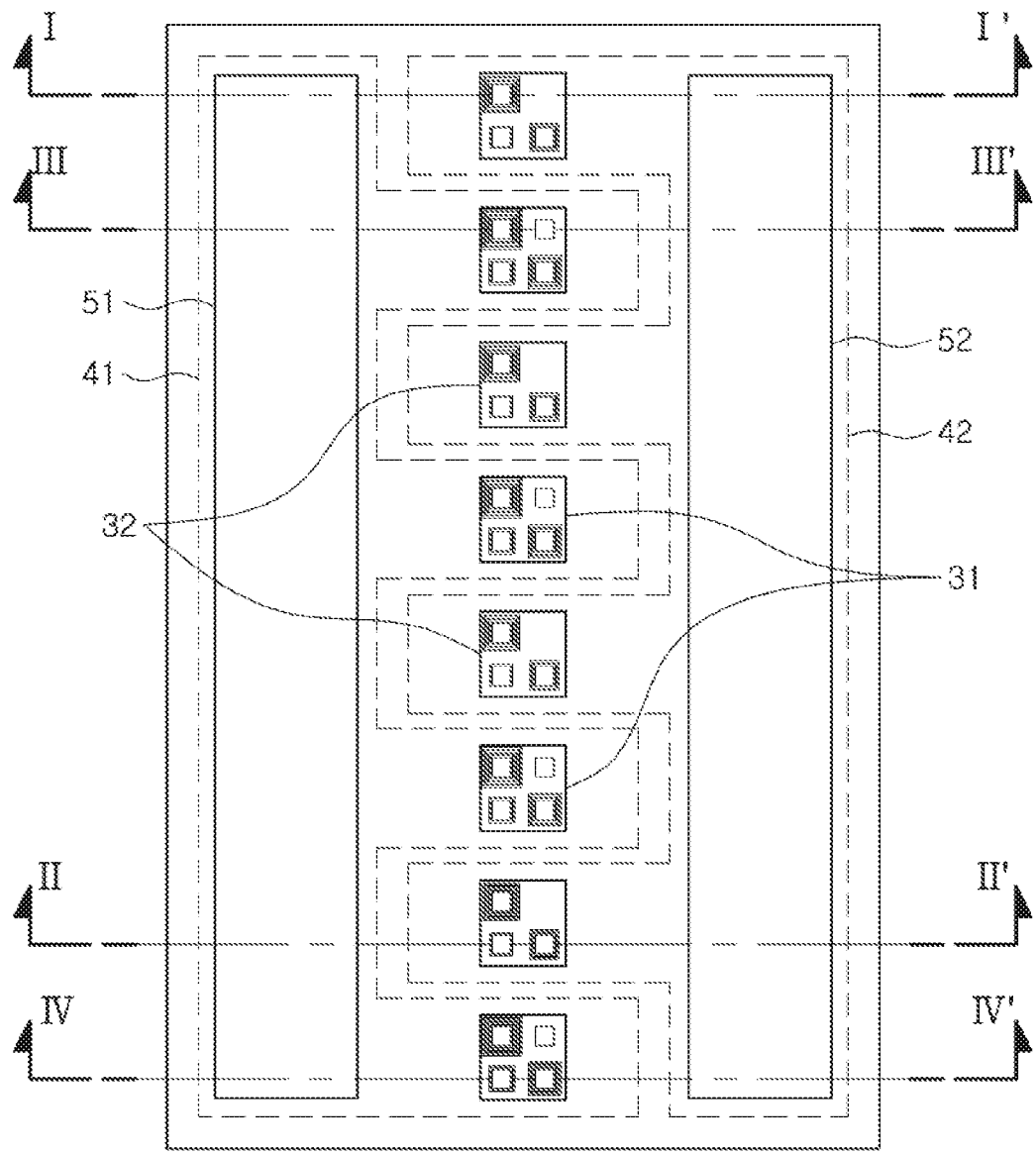
FIG. 2 is a plan view of a thin-film capacitor according to an exemplary embodiment in the present disclosure.

FIG. 1 is a schematic perspective view of a thin-film capacitor according to an exemplary embodiment in the present disclosure. FIG. 2 is a plan view of a thin-film capacitor according to an exemplary embodiment in the present disclosure.

Referring to FIGS. 1 and 2, a thin-film capacitor 100 according to an exemplary embodiment in the present disclosure includes a body 20 formed by alternately stacking first and second electrode layers and a dielectric layer on a substrate 10. A plurality of vias 31 and 32 are disposed in the body 20. Among the plurality of vias, a first via 31 is electrically connected to the first electrode layer and a second via 32 is electrically connected to the second electrode layer.

The thin-film capacitor 100 according to an exemplary embodiment in the present disclosure includes first and second electrode pads 51 and 52 disposed outside the body 20 and in positions such that the first and second electrode pads 51 and 52 do not overlap the first and second vias 31 and 32, respectively, with respect to a stacking direction. A first connection electrode 41 is disposed outside the body 20 and electrically connects the first electrode pad 51 and the first via 31. A second connection electrode 42 is disposed outside the body 20 and electrically connects the second electrode pad 52 and the second via 32.

Among the plurality of vias, the first via 31 connects the first electrode layer and the first electrode pad 51 and the second via 32 connects the second electrode layer and the second electrode pad 52.

According to an exemplary embodiment in the present disclosure, a "length direction" of the thin-film capacitor may be defined as an "L" direction of FIG. 1, a "width direction" may be defined as a "W direction", and a "thickness direction" may be defined as a "T direction" of FIG. 1. The "thickness direction" may be the "stacking direction" in which the dielectric layers and electrode layers are stacked.

The body 20 is not limited in shape and generally may have a hexahedral shape. The thin-film capacitor may be a high-stacked thin-film capacitor with high capacitance having a size of 0.6 mm×0.3 mm and capacitance of 1.0 μF or more, but is not limited thereto.

The thin-film capacitor 100 may have a substrate 10 with insulating properties in a layer of the substrate in contact with the first and second electrode layers 21 and 22. The substrate 10 may be formed of a material selected from among $Al_2O_3$, $SiO_2/Si$, MgO, $LaAlO_3$, and $SrTiO_3$, but is not limited thereto. The substrate 10 preferably has sufficient flatness and surface roughness.

According to an exemplary embodiment in the present disclosure, the first via 31 and the second via 32 are units respectively including a plurality of vias, and the first via 31 unit and the second via 32 unit are alternately disposed on an upper surface of the body 20.

In general, in a thin-film capacitor, when vias connecting internal electrodes have a concentric circle shape and the cross-sectional shape thereof has a multi-stage shape, a problem may arise in that, as the number of stacked internal electrodes is increased, the outer diameter of the via is significantly increased.

In the case of the aforementioned structure, as the outer diameter of the via is significantly increased, the disposition space of the via is insufficient, which may limit any increase to the number of stacked internal electrodes.

In contrast, according to an exemplary embodiment in the present disclosure, since the first via 31 and the second via 32 are units respectively include a plurality of vias and the first via 31 unit and the second via 32 unit are alternately disposed on an upper surface of the body 20, the number of stacked first and second electrode layers may be increased to realize a capacitor with high capacitance.

The plurality of vias included in the first via 31 and the second via 32 may have a quadrangular shape but are not limited thereto.

When a via connecting a plurality of electrode layers is manufactured, an area of an electrically connected portion of each layer is formed to be the same to minimize loss of a dielectric layer area, whereby greater capacitance with respect to a multilayer capacitor in which the same layer is stacked may be obtained, and a larger number of layers may be stacked in a capacitor having the same size.

In an exemplary embodiment in the present disclosure, since the via disposed in the thin film capacitor is configured as a unit including a plurality of vias, a larger number of vias may be disposed to reduce ESL and ESR, and the number of stacked electrode layers is increased to realize a capacitor with high capacitance.

The plurality of vias included in the first via 31 unit and the second via 32 unit may have a quadrangular shape, in particular, a square shape. FIG. 2 illustrates a plurality of vias included in the first via 31 unit and the second via 32 unit having a square shape, but the plurality of vias included in the first via 31 unit and the second via 32 unit may instead have a circular shape.

When the plurality of vias included in the first via 31 unit and the second via 32 unit have a quadrangular shape, the portion in which vias are electrically connected to each layer may have the same area.

That is, in each layer, an upper surface of the electrode layer is exposed and the area of the exposed upper surface of the electrode layer may be the same in each layer.

Vias connected to the same layer may have the same area, and since the plurality of vias included in the first via 31 unit and the second via 32 unit have a quadrangular shape, a larger number of vias may be disposed to reduce ESL and ESR and the stacking number of electrode layers may be increased to realize a capacitor with high capacitance.

Since the plurality of vias included in the first via 31 unit and the second via 32 unit have a quadrangular shape, the contact area between each of the vias and the electrode layer may be the same to maintain the same resistance component of a current path connected to each electrode layer.

When a current flows from the via to the electrode layer, the contact area between the via and the electrode layer is large and resistance is reduced. When the contact area is small, resistance is increased.

Thus, as in an exemplary embodiment in the present disclosure, when the plurality of vias included in the first via 31 unit and the second via 32 unit have the quadrangular shape, resistance that occurred in a portion connected to each dielectric layer may be maintained to be equal, preventing electric charges from concentrating to a specific electrode layer, so that the electric charges are evenly distributed.

In this manner, when the plurality of vias included in the first via 31 unit and the second via 32 unit have a quadrangular shape, low resistance may be evenly distributed in each electrode layer, facilitating controlling of ESR.

Hereinafter, a cross-sectional shape of the plurality of vias included in the first via 31 unit and the second via 32 unit will be described in detail, but is not limited thereto.

Figure 3A:
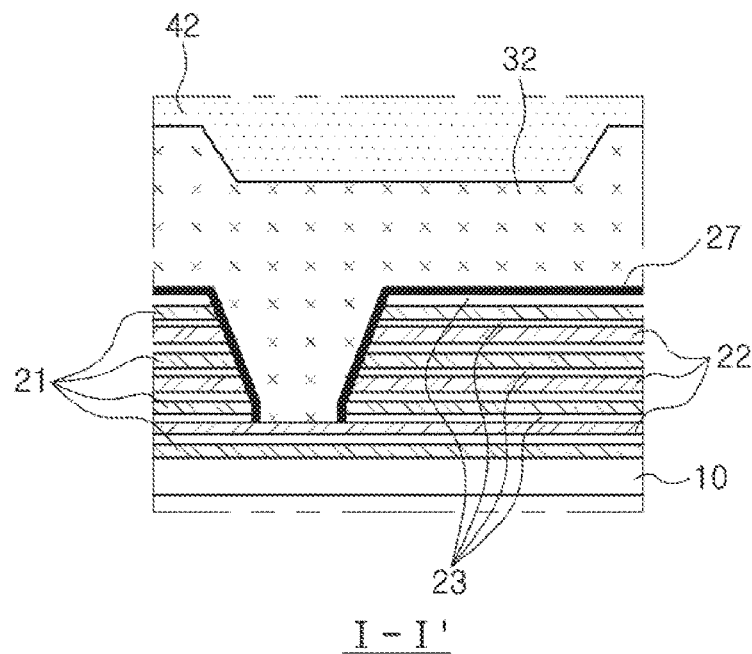
FIG. 3A is a cross-sectional view taken along line I-I' of FIG. 2.

FIG. 3A is a cross-sectional view taken along line I-I' of FIG. 2.

Figure 3B:
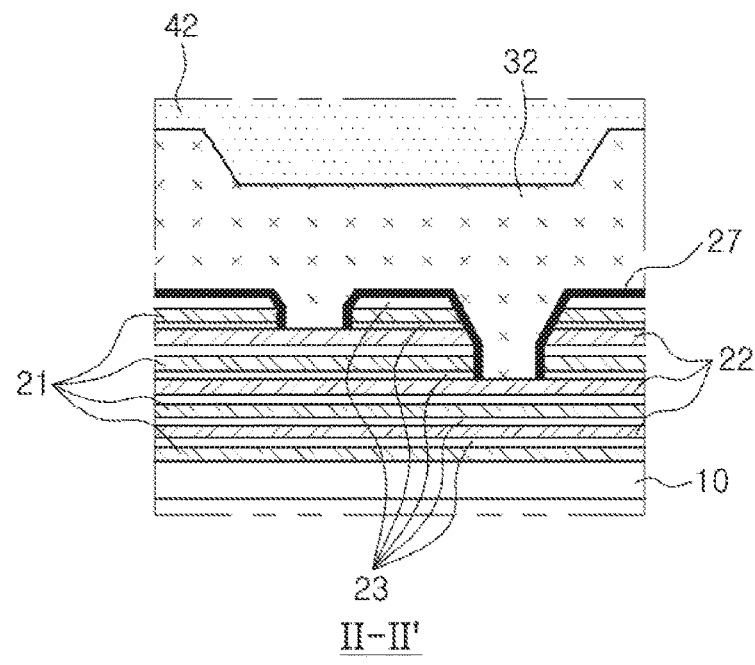
FIG. 3B is a cross-sectional view taken along line II-II' of FIG. 2.

FIG. 3B is a cross-sectional view taken along line II-II' of FIG. 2.

Figure 3C:
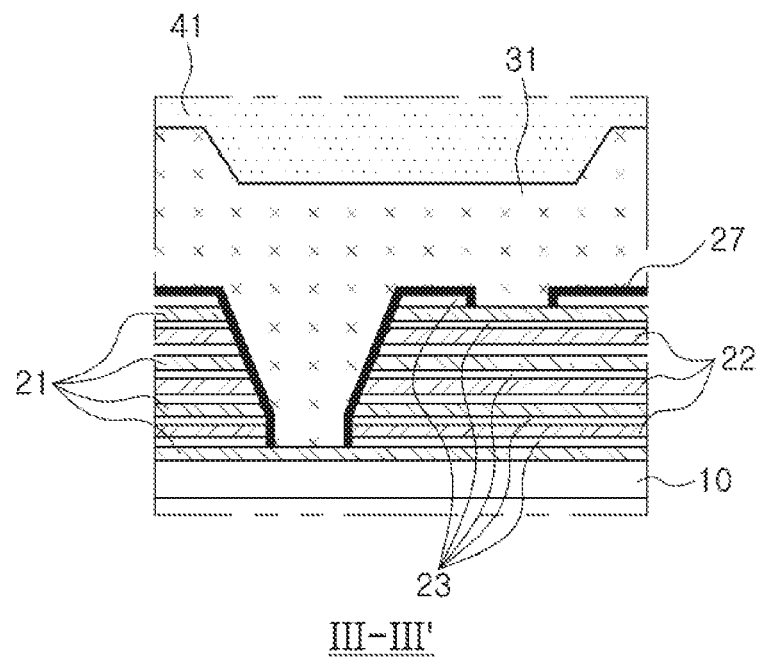
FIG. 3C is a cross-sectional view taken along line of FIG. 2.

FIG. 3C is a cross-sectional view taken along line III-III' of FIG. 2.

Figure 3D:
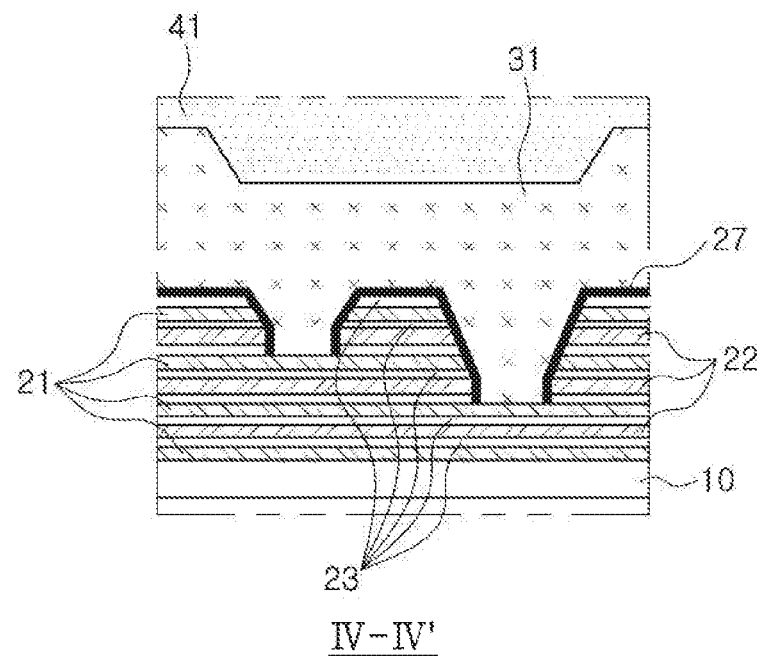
FIG. 3D is a cross-sectional view taken along line IV-IV' of FIG. 2.

FIG. 3D is a cross-sectional view taken along line IV-IV' of FIG. 2.

Referring to FIGS. 3A through 3D, the body 20 has a stacked structure in which the first electrode layer 21 is formed on the substrate 10, the dielectric layer 23 is formed on the first electrode layer 21, and the second electrode layer 22 is formed on the dielectric layer 23. That is, a plurality of first electrode layers 21 and a plurality of second electrode layers 22 are alternately stacked with dielectric layers 23 interposed therebetween. However, the stacked structure is not limited to the stacking number illustrated in the drawings.

The body 20 may be formed by stacking the dielectric layers 23 and the first and second electrode layers 21 and 22 on the substrate such that the dielectric layers 23 and the first and second electrode layers 21 and 22 are alternately stacked.

The body 20 may be formed by stacking the plurality of dielectric layers 23 in the thickness direction while alternately stacking the first and second electrode layers 21 and 22 to face the dielectric layer 23.

In an exemplary embodiment in the present disclosure, in order to selectively connect the stacked electrode layers of the thin-film capacitor, inter-layer etching is performed to have different areas, thus forming the vias to have multistage shape, i.e., a step shape.

An insulating layer is formed on an internal electrode to be insulated among the internal electrodes exposed within the via etched to have a step shape, thus preventing an electrical connection.

Thereafter, only the electrode to be connected is exposed, a seed layer is formed by electroless plating or sputtering, and a conductive metal is filled by plating to form an electrode connection layer.

According to an exemplary embodiment in the present disclosure, since the thin-film capacitor is manufactured by first stacking the dielectric layers 23 and the first and second electrode layers 21 and 22 all together, damage that may be done due to exposure to an external environment may be minimized.

As the first and second electrode layers 21 and 22 and the dielectric layers 23 are increasingly stacked as multiple layers, the ESR of the capacitor may be decreased.

The first and second electrode layers 21 and 22 may be formed as a single layer without a predetermined pattern.

The first and second electrode layers 21 and 22 may be formed of a conductive material.

The conductive material may be copper (Cu), aluminum (Al), gold (Au), silver (Ag), platinum (Pt), iridium (Ir), ruthenium (Ru), and the like, but is not limited thereto.

High temperature heat history may be entailed during a process of forming the dielectric layer, a high-k thin film, which may cause the electrode layer to be spread to the dielectric layer or react to the dielectric layer to increase a leakage current in the capacitor.

The first and second electrode layers 21 and 22 may be formed of platinum (Pt), a high melting point material, whereby spreading or reaction thereof to the dielectric layer may be reduced.

The dielectric layer 23 may include a perovskite material having high permittivity.

The perovskite material may be one selected from dielectric materials whose permittivity is significantly changed, for example, a barium titanate ($BaTiO_3$)-based material, a strontium titanate ($SrTiO_3$)-based material, a (Ba,Sr) $TiO_3$-based material, and a PZT-based material, but is not limited thereto.

The first via 31 is electrically connected to the first electrode layer 21, the second via 32 is electrically connected to the second electrode layer 22. The first via 31 and the second via 32 may be electrically insulated from each other.

The first and second vias 31 and 32 may be formed of a conductive material and may be formed by plating. Accordingly, a dimple may be formed on an upper surface of each of the first and second vias 31 and 32.

The conductive material may be Cu, Al, Au, Ag, Pt, and the like, but is not limited thereto.

The first and second vias 31 and 32 are formed in plurality. When the first and second vias are formed in plurality, the contact surface by which the first and second vias 31 and 32 are respectively in contact with the first and second electrode layers 21 and 22 may be increased to lower the ESR of the capacitor.

Referring to FIGS. 1, 2, and 3A through 3D, the first and second connection electrodes 41 and 42 are formed to connect the first and second vias 31 and 32 to the first and second electrode pads 51 and 52, respectively.

The first and second connection electrodes 41 and 42 may be formed of a conductive material and may be formed through plating.

The conductive material may be Cu, Al, Au, Ag, Pt, and the like, but is not limited thereto.

The first and second electrode pads 51 and 52 may be formed on an upper surface of the body 20 and may be electrically connected to the first and second electrode layers 21 and 22 through the plurality of vias 31 and 32 exposed to one surface of the body 20, respectively.

The first and second electrode pads 51 and 52 may be formed through electroplating or electroless plating after a seed layer is formed through a thin film formation process such as sputtering or e-beam deposition on an upper surface of the body 20.

The first and second electrode pads 51 and 52 may include a conductive material.

The conductive material may be Cu, Al, Au, Ag, Pt, and the like, but is not limited thereto.

The first and second electrode pads 51 and 52 may include seed layers 51a and 52a and electrode layers 51b and 52b grown from the seed layers 51a and 52a.

The first and second electrode pads 51 and 52 are disposed in positions where the first and second electrode pads 51 and 52 do not overlap the first and second vias 31 and 32 with respect to a stacking direction of the dielectric layer and the electrode layers.

The first and second electrode pads 51 and 52 may be integrated with the first and second connection electrodes 41 and 42 or may be disposed on the first and second connection electrodes 41 and 42.

Due to the disposition of the vias 31 and 32, the first and second connection electrodes 41 and 42 may have a comb shape. The comb shape of the first and second connection electrodes 41 and 42 may be a shape in which the first and second connection electrodes are alternately engaged.

The first connection electrode 41 may include a plurality of first connection portions respectively connected from the plurality of first vias and a first electrode portion connected to the plurality of first connection portions. The second connection electrode 42 may include a plurality of second connection portions respectively connected from the plurality of second vias and a second electrode portion connected to the plurality of second connection portions.

Since the first connection electrode 41 and the second connection electrode 42 also have mutually opposite polarities, better ESL reduction effect may be obtained as the first connection electrode and the second connection electrode are closer to each other.

The plurality of first and second connection portions may be branches extending from the plurality of first and second vias.

An insulating layer 27 may be formed to electrically connect the first via 31 and the second via 32 to the first electrode layer 21 and the second electrode layer 22, respectively.

The insulating layer 27 may be formed between the first via 31 and the dielectric layer 23 and the second electrode layer 22, and between the second via 32 and the dielectric layer 23 and the first electrode layer 21.

The insulating layer 27 may secure insulation between the first via and the second electrode layer and insulation between the second via and the first electrode layer. Since the insulating layer 27 is formed on a surface of the dielectric layer, parasitic capacitance generated therein may be reduced.

The insulating layer 27 may be formed of an organic material such as benzocyclobutene (BCB), polyimide, and the like, or an inorganic material such as $SiO_2$, $Si_3N_4$, and the like, and has permittivity lower than that of a material of the dielectric layer in order to obtain high insulating properties and reduce parasitic capacitance.

The insulating layer 27 may be formed through chemical vapor deposition (CVD) allowing a film to have a uniform thickness in a three-dimensionally complex shape.

A protective layer 25 may be formed to prevent a degradation of a material of the body 20 and the first and second connection electrodes 41 and 42 due to a chemical reaction that may be made with humidity and oxygen from the outside, contamination, and damage when the capacitor is mounted.

The protective layer 25 may be formed of a material with high heat resistance and may be formed of an organic heat-curing material or a photo-curing material such as polyimide, for example.

FIGS. 3A and 3B illustrate cross-sectional shapes of a plurality of vias included in the second via 32 unit.

The via included in the second via 32 unit illustrated in FIG. 3A connects the second electrode layer 22 and the second electrode pad 52 and penetrates through from one surface of the body 20 to the lowermost second electrode layer 22 adjacent to the substrate 10.

Any one of the plurality of vias included in the second via 32 unit may be connected to the entirety of the second electrode layers disposed within the body 20.

In the second via 32 unit illustrated in FIG. 3B, a via connected to a first second electrode layer 22 from an upper surface of the body 20 and a via penetrating to be connected to a second electrode layer 22 from the upper surface of the body 20 are disposed to be adjacent to each other.

FIGS. 3A and 3B illustrate three stacked second electrode layers 22. The via illustrated in FIG. 3A is connected to all three second electrode layers 22, and the vias illustrated in FIG. 3B are connected to one second electrode layer 22 and two second electrode layers 22, respectively.

Referring to FIGS. 3C and 3D, a cross-sectional shape of the plurality of vias included in the first via 31 unit is illustrated.

The via included in the first via 31 unit illustrated in FIG. 3C connects the first electrode layer 21 and the first electrode pad 51, and penetrates through from one surface of the body 20 to a lowermost first electrode layer 21 adjacent to the substrate 10 so as to be connected to all of the first electrode layers 21.

Any one of the plurality of vias included in the first via 31 unit may be connected to all of the first electrode layers 21 disposed within the body 20.

A via connected from the upper surface of the body 20 to the first of the first electrode layers 21 is disposed to be adjacent to the via connected to all of the first electrode layers 21.

In the first via 31 unit illustrated in FIG. 3D, a via penetrates through from the upper surface of the body 20 to the second first electrode layer 21 so as to be connected to the first electrode layer and another via penetrates through to the third first electrode layer 21 so as to be connected to the first electrode layer. The two vias are disposed to be adjacent to each other.

FIGS. 3C and 3D illustrate four stacked first electrode layers 21. In FIG. 3C, the via connected to all of the four first electrode layers 21 and a via connected from the upper surface of the body 20 to the first of the first electrode layers 21 are disposed to be adjacent to each other. FIG. 3D illustrates vias connected to two first electrode layers 21 and three first electrodes layer 21, respectively.

According to an exemplary embodiment in the present disclosure, the plurality of vias 31 and 32 have a multi-stage shape, i.e., a step shape, and the widths of the respective steps are increased upwardly from the substrate 10 in the body 20.

Since the first and second vias 31 and 32 are formed such that widths of the respective steps thereof are increased upwardly from the substrate 10 in the body 20, the insulating layer 27 may be disposed on the etched cut surfaces of the first electrode layer 21 exposed within the first via 31 and the second electrode layer 22 exposed within the second via 32 and upper surfaces of the first electrode layer 21 and the second electrode layer 22 may be exposed.

A via, included in the first via 31, connected to the entirety of the first electrode layers 21 is formed by performing etching repeatedly up to a layer from which the first electrode layer 21 is exposed and has a multi-stage shape, i.e., a step shape. Since the widths of the steps are increased upwardly from the substrate 10 in the body 20, the insulating layer 27 may be disposed on the etched cut surfaces of the dielectric layer 23 and the first and second electrode layers 21 and 22 so that only an upper surface of the first electrode layer 21 is exposed after the insulating process.

Accordingly, the first electrode layer 21 may be electrically connected to the first electrode pad 51 through the first via 31.

A via, included in the second via 32, connected to the entire second electrode layers 22 is formed by performing etching repeatedly up to a layer from which the second electrode layer 22 is exposed and has a multi-stage shape, i.e., a step shape. Since the widths of the steps are increased upwardly from the substrate 10 in the body 20, the insulating layer 27 may be disposed on the etched cut surfaces of the dielectric layer 23 and the first and second electrode layers 21 and 22 so that only an upper surface of the second electrode layer 22 is exposed after the insulating process.

Accordingly, the second electrode layer 22 is electrically connected to the second electrode pad 52 through the second via 32.

The insulating layer 27 may be disposed on the second electrode layer 22 exposed within the second via 32 and on the first electrode layer 21 exposed within the second via 32.

The insulating layer 27 may be disposed on the etched cut surfaces of the second electrode layer 22 exposed within the first via 31 and the first electrode layer 21 exposed within the second via 32.

The first via 31 unit is provided in plural, and vias having the same shape among the plurality of first via 31 units have the same depth. The second via 32 unit is provided in plural, and vias having the same shape among the plurality of second via 32 units have the same depth.

According to an exemplary embodiment in the present disclosure, in the via of each layer, an upper surface of each electrode layer is exposed, and the exposed upper surface is a portion electrically connecting the electrode layer and the electrode pad, and areas of the exposed portions of the respective electrode layers as electrical connection portions are the same.

When the via connecting the plurality of electrode layers is manufactured, since the electrically connected portions in each layer have the same area, the loss of dielectric layer area may be minimized, obtaining greater capacitance as compared to a multilayer capacitor with the same number of stacked layers. In addition, a larger number of layers may be stacked in a capacitor having the same size.

In the thin film capacitor according to an exemplary embodiment in the present disclosure, since the via is configured as a unit including a plurality of vias, a larger number of vias may be disposed to reduce ESL and ESR and the number of stacked electrode layers may be increased to realize a high capacitance.

Hereinafter, an example of manufacturing a thin-film capacitor according to an exemplary embodiment in the present disclosure will be described, but the present disclosure is not limited thereto.

FIGS. 4A through 4J are views illustrating a process of forming a via within a thin-film capacitor according to an exemplary embodiment in the present disclosure.

Hereinafter, a process of forming a via within a thin-film capacitor will be described with reference to FIGS. 4A through 4J.

Figure 4A:
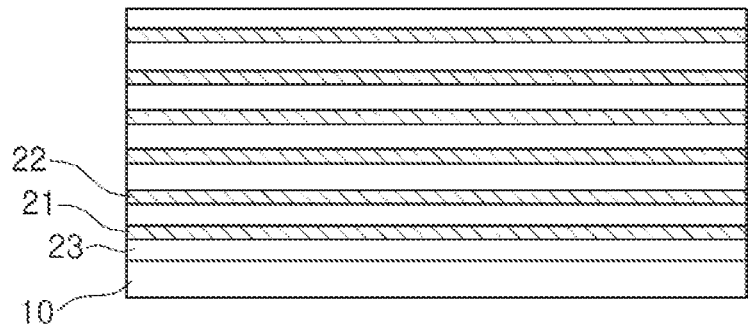
FIGS. 4A through 4J are views illustrating a process of forming a via within a thin-film capacitor according to an exemplary embodiment in the present disclosure.

Referring to FIG. 4A, a stacked body may be prepared by stacking dielectric layers 23 and first and second electrode layers 21 and 22 on a substrate 10 such that the dielectric layer 23 and the first and second electrode layers 21 and 22 are alternately stacked.

The substrate 10 is not limited and may be prepreg, for example.

A perovskite-based dielectric material such as barium titanate ($BaTiO_3$), or the like, is deposited on the substrate 10 to form the dielectric layer 23, and a conductive metal is deposited thereon using a thin film formation process such as sputtering, e-beam deposition, and the like, to form the first electrode layer 21, and the dielectric layer 23 and the second electrode layer 22 are formed thereon.

Accordingly, the plurality of first and second electrode layers 21 and 22 are formed to be alternately stacked on opposing surfaces of the dielectric layer 23.

The dielectric layer 23 and the first and second electrode layers 21 and 22 may be stacked through deposition but the method used is not limited thereto and may be a method such as chemical solution deposition (CSD).

The dielectric layer 23 and the first and second electrode layers 21 and 22 are stacked all together without separate patterning in a vacuum state.

Figure 4B:
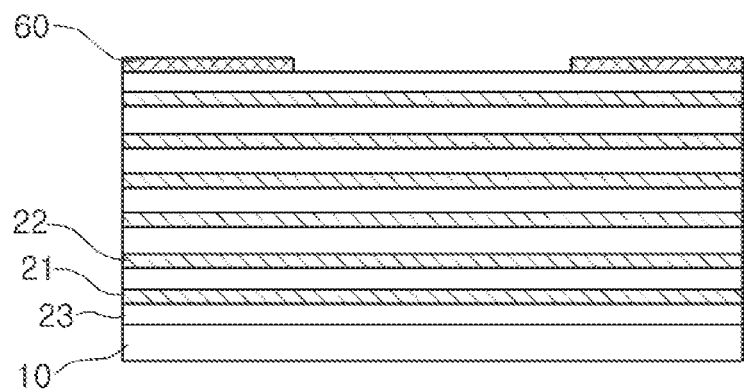

Referring to FIG. 4B, a photoresist 60 is applied to an upper surface of the stacked body in order to expose interlayer electrodes disposed in the stacked body, and is patterned through exposure and development.

Figure 4C:
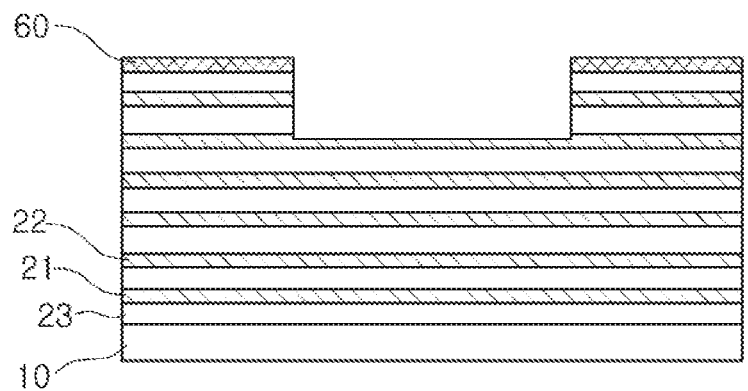

Referring to FIG. 4C, etching is performed up to a predetermined electrode layer to form a via.

The via illustrated in FIG. 4C is a first via formed by etching up to the first electrode layer adjacent to an upper surface of the stacked body such that the first electrode layer closest to the upper surface of the stacked body is exposed.

Figure 4D:
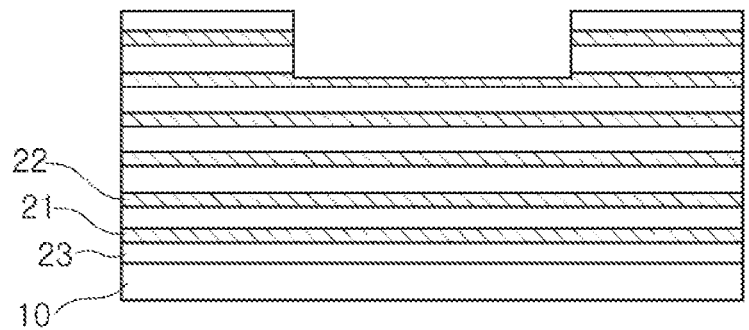

Referring to FIG. 4D, the patterned photoresist 60 is removed.

Figure 4E:
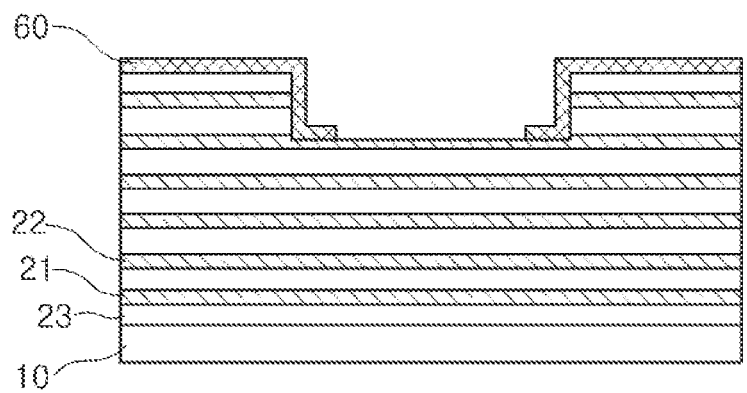

Referring to FIG. 4E, the photoresist 60 is applied from the upper surface of the stacked body to a lower surface of the via, i.e., to an upper surface of the exposed first electrode layer, and is patterned through exposure and development.

The patterned photoresist 60 is patterned to have an area narrower than that of the photoresist patterned in FIG. 4B.

Figure 4F:
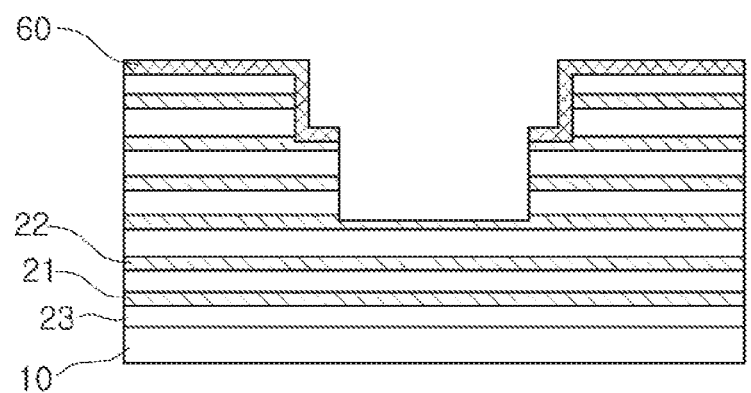

Referring to FIG. 4F, etching is performed up to a next predetermined electrode layer to form a via.

The via illustrated in FIG. 4F is a first via formed by etching up to the first electrode layer closest to the upper surface of the stacked body in a direction of the substrate such that a first electrode layer next to the first electrode layer closest to the upper surface of the stacked body is exposed, so as to be connected to the first electrode layer.

During the etching process, the dielectric layer and the second electrode layer disposed between the first electrode layer closest to the upper surface and the next first electrode layer are simultaneously exposed.

That is, layers penetrated through per one etching process include two or more electrodes and the dielectric layer.

The via is formed to have a width smaller than that of the via formed by etching such that the first electrode layer closest to the upper surface of the stacked body is exposed.

According to an exemplary embodiment in the present disclosure, a plurality of vias are formed by repeating the aforementioned process, and here, each of the vias is formed such that a width thereof is smaller than that of an upper via adjacent thereto.

Figure 4G:
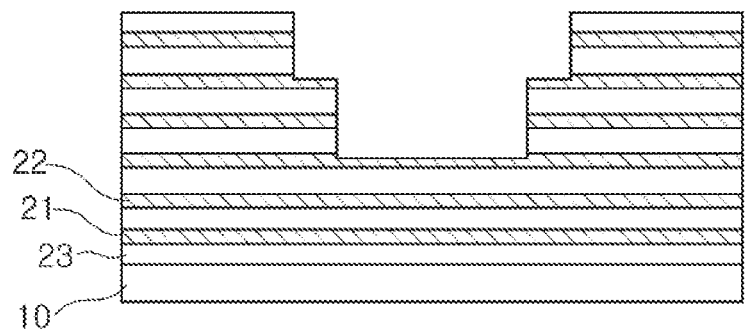

Referring to FIG. 4G, the patterned photoresist 60 is removed.

Figure 4H:
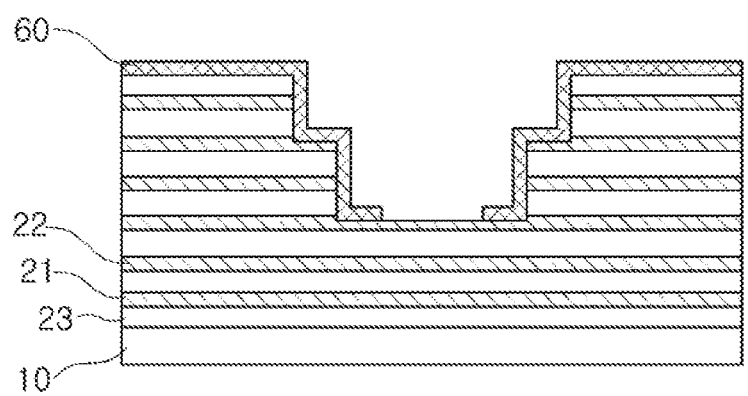

Referring to FIG. 4H, photoresist is applied from the upper surface of the stacked body to a lower surface of the via formed in FIG. 4F, i.e., to an upper surface of the exposed first electrode layer, and is patterned through exposure and development.

The patterned photoresist 60 is patterned to have an area narrower than that of the photoresist 60 patterned in FIG. 4E.

Figure 4I:
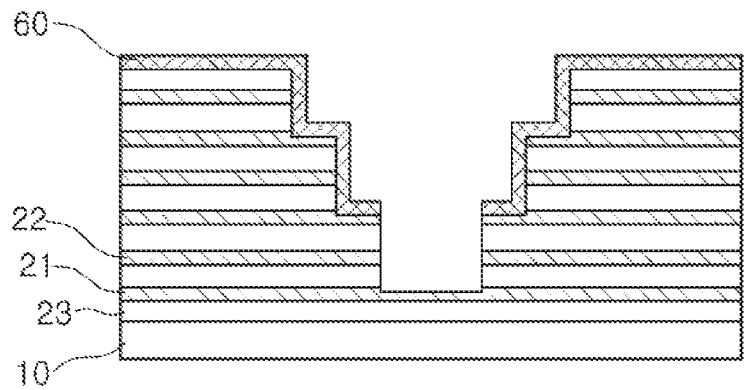

Referring to FIG. 4I, etching is performed up to a next predetermined electrode layer to form a via.

As illustrated in FIG. 4I, etching is performed such that a first electrode layer disposed below the first electrode layer exposed in FIG. 4F is exposed to form a via.

Through the etching, a dielectric layer and a second electrode layer disposed between the first electrode layer exposed in FIG. 4F and the first electrode layer disposed therebelow are simultaneously exposed.

The via is formed to have a width smaller than that of the via formed in FIG. 4F.

Figure 4J:
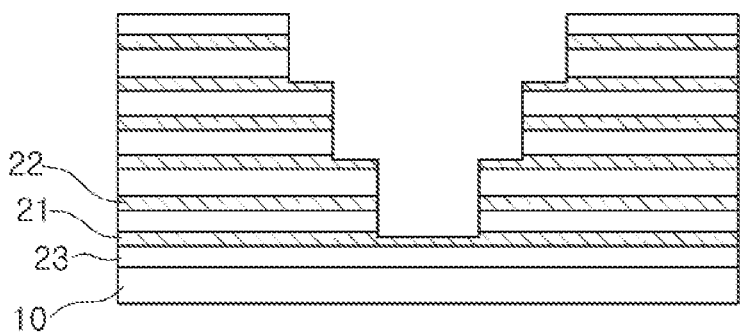

Referring to FIG. 4J, the patterned photoresist 60 is removed.

FIGS. 5A through 5D are views illustrating a process of forming an insulating layer in a via within a thin-film capacitor according to another exemplary embodiment in the present disclosure.

FIGS. 5A through 5D illustrate a process of patterning an insulating layer to selectively connect exposed electrodes.

The first via is required to be connected to the first electrode layer and the simultaneously exposed second electrode layer should be insulated. The second via is required to be connected to the second electrode layer and the simultaneously exposed first electrode layer should be insulated.

Thus, in the case of the first via, the second electrode layer should be blocked from an electrical connection by a dielectric or insulating layer, and in the case of the second via, the first electrode layer should be blocked from an electrical connection by a dielectric or insulating layer.

Figure 5A:
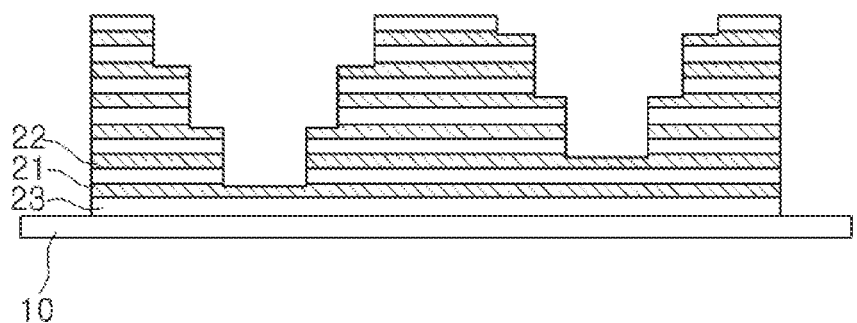
FIGS. 5A through 5D are views illustrating a process of forming an insulating layer in a via within a thin-film capacitor according to an exemplary embodiment in the present disclosure.

FIG. 5A illustrates a cross-section of a stacked body in which the first via and the second via are formed through the process of FIGS. 4A through 4J.

The first via penetrates through from one surface of the stacked body to a lowermost first electrode layer adjacent to the substrate 10, and the second via penetrates through from one surface of the stacked body to a lowermost second electrode layer adjacent to the substrate 10.

According to an exemplary embodiment in the present disclosure, the first and second vias have a multi-stage shape, a step shape, and widths of the steps are increased upwardly from the substrate 10 in the stacked body.

In this manner, since the widths of the steps of the first and second vias are manufactured to be increased upwardly from the substrate 10 in the stacked body, the first via may be connected to all of the first electrode layers and the second via may be connected to all of the second electrode layers.

Figure 5B:
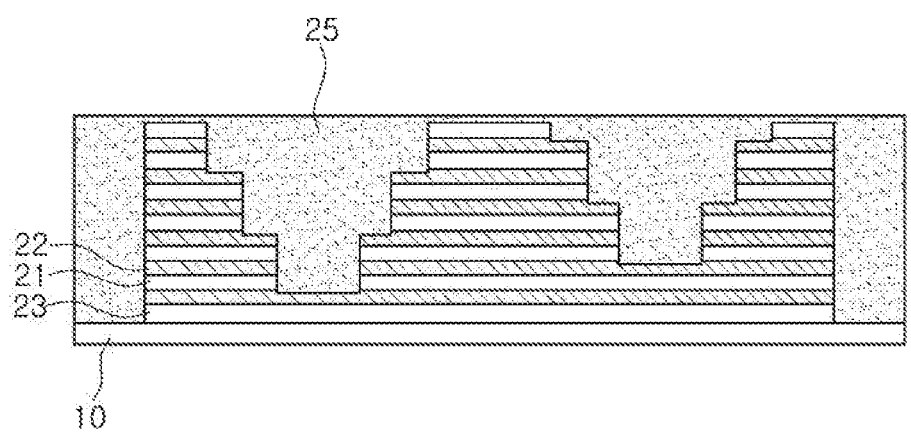

Referring to FIG. 5B, after the plurality of vias having a multi-stage shape are formed within the stacked body, the upper surface of the substrate 10 and the entirety of the stacked body are coated with an insulating material.

Figure 5C:
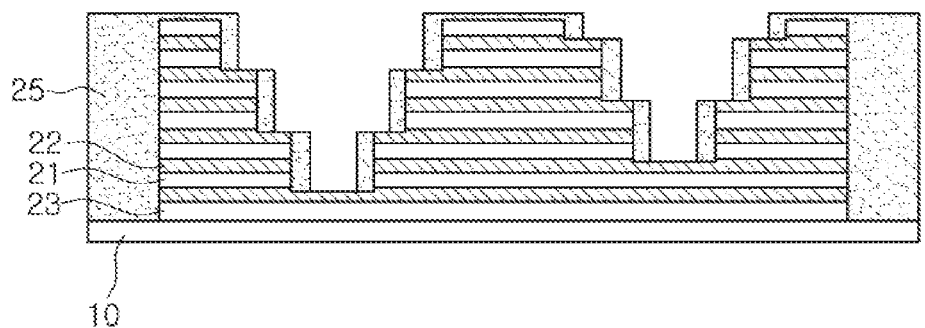

Referring to FIG. 5C, the insulating material is etched to form an insulating layer and a protective layer 25 within the plurality of vias 31 and 32.

The insulating layer is formed on etched cut surfaces of the dielectric layer 23 and the first and second electrode layers 21 and 22 within the plurality of vias 31 and 32.

Since the widths of the steps of the first and second vias are increased upwardly from the substrate 10 in the stacked body, the insulating layer may be disposed on the etched cut surface of the first electrode layer 21 exposed within the first via 31 and the etched cut surface of the second electrode layer 22 exposed within the second via 32 and upper surfaces of the first electrode layer 21 and the second electrode layer 22 may be exposed.

Also, the first via 31 is formed by performing etching a plurality of times to a layer from which the first electrode layer 21 is exposed, and has a multi-stage shape as a step shape. Since the widths of the steps are increased upwardly from the substrate 10 in the stacked body, the insulating layer may be disposed on the etched cut surfaces of the dielectric layer 23 and the first and second electrode layers 21 and 22 and only an upper surface of the first electrode layer 21 may be exposed after the insulation process.

The second via 32 is formed by performing etching a plurality of times to a layer from which the second electrode layer 22 is exposed, and has a multi-stage shape as a step shape. Since the widths of the steps are increased upwardly from the substrate 10 in the stacked body, the insulating layer may be disposed on the etched cut surfaces of the dielectric layer 23 and the first and second electrode layers 21 and 22 and only an upper surface of the second electrode layer 22 may be exposed after the insulation process.

According to an exemplary embodiment in the present disclosure, any one of the first vias 31 may be connected to all of the first electrode layers 21 disposed within the stacked body, and any one of the second vias 32 may be connected to all of the second electrode layers 22 disposed within the stacked body.

The first via 31 unit is provided in plural and vias having the same shape among the plurality of first vias 31 units have the same depth. The second via 32 unit is provided in plural and vias having the same shape among the plurality of second vias 32 units have the same depth.

Figure 5D:
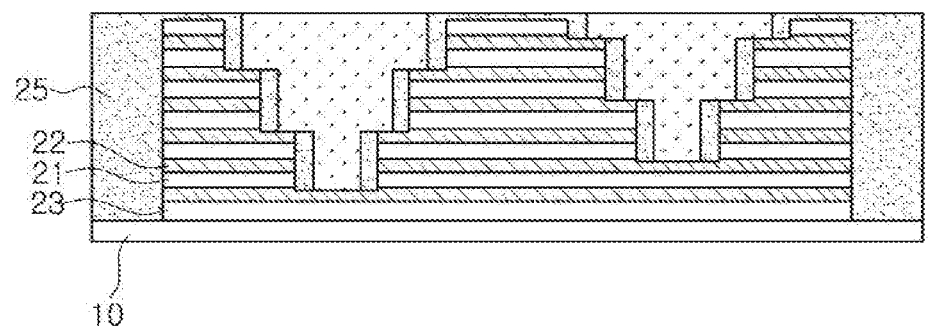

Referring to FIG. 5D, the first and second vias 31 and 32 are filled with a conductive metal. In the process of filling the first and second vias 31 and 32 with a conductive metal, a seed layer is formed on a surface of each of the exposed electrode layer and a conductive metal is filled through a plating method to connect the electrode layer and an external electrode.

As set forth above, according to an exemplary embodiment in the present disclosure, since the dielectric layers and the electrode layers are first stacked together and subsequently electrically connected to the via having a multi-stage shape, when a thin film is deposited, damage due to an external environment may be minimized and a thinner compact product may be realized.

Since all the layers required to be electrically connected are connected by one via, a reduction in an area due to via may be minimized to increase capacitance.

Since the structure is simplified through insulating layer patterning within the via, the stacking number of the thin-film capacitor may be increased to obtain high capacitance.

The thin-film capacitor according to an exemplary embodiment in the present disclosure may have low ELS and low ESR.

When a via connecting a plurality of electrode layers is manufactured, the area of the electrically connected portion of each layer is formed to be the same to minimize loss of a dielectric layer area, whereby greater capacitance with respect to a multilayer capacitor in which the same layer is stacked may be obtained. In addition, a larger number of layers may be stacked in a capacitor having the same size.

In an exemplary embodiment in the present disclosure, since the via disposed in the thin film capacitor is configured as a unit including a plurality of vias, a larger number of vias may be disposed to reduce ESL and ESR, and the stacking number of electrode layers is increased to realize a capacitor with high capacitance.

While exemplary embodiments have been shown and described above, it will be apparent to those skilled in the art that modifications and variations could be made without departing from the scope of the present invention as defined by the appended claims.

What is claimed is:

1. A thin-film capacitor comprising:
 a body in which a plurality of dielectric layers and first and second electrode layers are alternately stacked on a substrate;
 first and second electrode pads disposed on portions of an external surfaces surface of the body and opposing each other in a width direction of the body; and
 a plurality of vias within the body,
 wherein, among the plurality of vias, a first via connects the first electrode layer and the first electrode pad, and a second via connects the second electrode layer and the second electrode pad,
 the first via and the second via are units each including a plurality of sub-vias, and the first via unit and the second via unit are alternately disposed on an upper surface of the body,
 the first via unit and the second via unit are substantially disposed on a same line in a length direction of the body perpendicular to the width direction of the body,
 the plurality of sub-vias included in the first via unit includes a first group of sub-vias substantially disposed on a same line in the length direction of the body and a second group of sub-vias substantially disposed on a same line in the width direction of the body, and
 the plurality of sub-vias included in the second via unit includes a third group of sub-vias substantially disposed on a same line in the length direction of the body, and a fourth group of sub-vias substantially disposed on a same line in the width direction of the body.

2. The thin-film capacitor of claim 1, wherein, in the plurality of sub-vias included in the first via unit and the second via unit, areas of electrically connected portions in each layer are the same.

3. The thin-film capacitor of claim 1, wherein the first via is provided in plural, and vias among the plurality of first vias having the same shape have the same depth.

4. The thin-film capacitor of claim 1, wherein the second via is provided in plural, and vias among the plurality of second vias having the same shape have the same depth.

5. The thin-film capacitor of claim 1, wherein an insulating layer is disposed on the second electrode layer exposed within the first via and on the first electrode layer exposed within the second via.

6. The thin-film capacitor of claim 1, wherein an upper surface of the first electrode layer is exposed within the first via and an upper surface of the second electrode layer is exposed within the second via.

7. The thin-film capacitor of claim 1, wherein, in the plurality of sub-vias, widths of respective steps are increased upwardly from the substrate in the body.

8. The thin-film capacitor of claim 1, wherein the plurality of sub-vias-included in the first via and the second via have a quadrangular shape.

9. The thin-film capacitor of claim 1, wherein each of the plurality of sub-vias-included in the first via and the second via is in physical contact with only one of the first and second electrode layers.

10. A thin-film capacitor comprising:
a body in which first to fourth electrode layers are sequentially stacked in a thickness direction on a substrate with one dielectric layer between adjacent two electrode layers of the first to fourth electrode layers, side surfaces of the first to fourth electrode layers are aligned with each other in the thickness direction;
first and second electrode pads disposed on portions of the body;
a first connection electrode electrically connected to the first electrode pad, including a first body portion overlapping the first electrode pad and first and third combs extending from the first body portion of the first connection electrode;
a second connection electrode electrically connected to the second electrode pad, including a second body portion overlapping the second electrode pad and second and fourth combs extending from the second body portion of the second connection electrode and interleaved with the first and third combs of the first connection electrode;
a first via unit including two vias, overlapping the first comb along the thickness direction, and electrically connected to the first comb, wherein one of the two vias of the first via unit is in contact with only one of the first and third electrode layers in a region of the first via unit and another of the two vias of the first via unit is in contact with only another of the first and third electrode layers in the region of the first via unit;
a second via unit including two vias, overlapping the second comb along the thickness direction, and electrically connected to the second comb, wherein one of the two vias of the second via unit is in contact with only one of the second and fourth electrode layers in a region of the second via unit and another of the two vias of the second via unit is in contact with only another of the second and fourth electrode layers in the region of the second via unit;
a third via unit including two vias, overlapping the third comb along the thickness direction, and electrically connected to the third comb, wherein one of the two vias of the third via unit is in contact with only one of the first and third electrode layers in a region of the third via unit and another of the two vias of the third via unit is in contact with only another of the first and third electrode layers in the region of the third via unit; and
a fourth via unit including two vias, overlapping the fourth comb along the thickness direction, and electrically connected to the fourth comb, wherein one of the two vias of the fourth via unit is in contact with only one of the second and fourth electrode layers in a region of the fourth via unit and another of the two vias of the fourth via unit is in contact with only another of the second and fourth electrode layers in the region of the fourth via unit.

11. The thin-film capacitor of claim 10, wherein the plurality of vias included in the first to fourth via units have a quadrangular shape.

12. The thin-film capacitor of claim 10, wherein the first to fourth via units are substantially disposed on a same line in a length direction of the body,
the first and second electrode pads oppose each other in a width direction of the body perpendicular to the length direction of the body, and
the first and third combs extend in the width direction from the first body portion of the first connection electrode, and the second and fourth combs extend in the width direction from the second body portion of the second connection electrode.

13. A thin-film capacitor comprising:
a body in which a plurality of dielectric layers and first and second electrode layers are alternately stacked on a substrate;
first and second electrode pads disposed on portions of the body;
a first connection electrode electrically connected to the first electrode pad, including a first body portion overlapping the first electrode pad and combs extending from the first body portion of the first connection electrode;
a second connection electrode electrically connected to the second electrode pad, including a second body portion overlapping the second electrode pad and combs extending from the second body portion of the second connection electrode and interleaved with the combs of the first connection electrode; and
a plurality of vias within the body,
wherein, among the plurality of vias, a first via connects the first electrode layers and the first connection electrode, and a second via connects the second electrode layers and the second connection electrode,
the first via and the second via are units each including a plurality of sub-vias, and the first via unit and the second via unit are alternately disposed on regions of the body respectively overlapping the combs of the first and second electrode pads,
the plurality of sub-vias included in the first via unit includes a first group of sub-vias substantially disposed on a same line in the length direction of the body, and a second group of sub-vias substantially disposed on a same line in the width direction of the body, and
the plurality of sub-vias included in the second via unit includes a third group of sub-vias substantially disposed on a same line in the length direction of the body, and a fourth group of sub-vias substantially disposed on a same line in the width direction of the body.

14. The thin-film capacitor of claim 13, wherein, in the plurality of sub-vias included in the first via unit and the second via unit, areas of electrically connected portions in each layer are the same.

15. The thin-film capacitor of claim 13, wherein the first via is provided in plural, and vias among the plurality of first vias having the same shape have the same depth.

16. The thin-film capacitor of claim 13, wherein the second via is provided in plural, and vias among the plurality of second vias having the same shape have the same depth.

17. The thin-film capacitor of claim 13, wherein, in the plurality of sub-vias, widths of respective steps are increased upwardly from the substrate in the body.

18. The thin-film capacitor of claim 13, wherein the plurality of sub-vias included in the first via and the second via have a quadrangular shape.

19. The thin-film capacitor of claim 13, wherein each of the plurality of sub-vias included in the first via and the second via is in physical contact with only one of the first electrode layers or only one of the second electrode layers.

* * * * *